United States Patent
Ha et al.

(10) Patent No.: US 11,450,627 B2
(45) Date of Patent: Sep. 20, 2022

(54) SEMICONDUCTOR PACKAGE INCLUDING SEMICONDUCTOR CHIP AND CAPACITOR

(71) Applicant: SK hynix Inc., Icheon-si (KR)

(72) Inventors: Dae Hyeok Ha, Icheon-si (KR); Kyung Mi Son, Seongnam-si (KR)

(73) Assignee: SK hynix Inc., Icheon-si (KR)

(*) Notice: Subject to any disclaimer, the term of this patent is extended or adjusted under 35 U.S.C. 154(b) by 43 days.

(21) Appl. No.: 17/031,102

(22) Filed: Sep. 24, 2020

(65) Prior Publication Data
US 2021/0327831 A1    Oct. 21, 2021

(30) Foreign Application Priority Data
Apr. 16, 2020    (KR) .................. 10-2020-0046328

(51) Int. Cl.
| H01L 23/64 | (2006.01) |
| H01L 23/00 | (2006.01) |
| H01G 4/40 | (2006.01) |
| H01L 25/18 | (2006.01) |
| H01L 23/498 | (2006.01) |
| H01G 4/232 | (2006.01) |

(52) U.S. Cl.
CPC ............ *H01L 23/642* (2013.01); *H01L 24/32* (2013.01); *H01L 24/48* (2013.01); *H01L 24/73* (2013.01); *H01G 4/2325* (2013.01); *H01G 4/40* (2013.01); *H01L 23/49838* (2013.01); *H01L 25/18* (2013.01); *H01L 2224/32265* (2013.01); *H01L 2224/48227* (2013.01); *H01L 2224/48265* (2013.01); *H01L 2224/73265* (2013.01)

(58) Field of Classification Search
CPC ....... H01L 23/642; H01L 24/32; H01L 24/48; H01L 24/73; H01L 23/49838; H01L 25/18; H01L 2224/32265; H01L 2224/48227; H01L 2224/48265; H01L 2224/73265; H01G 4/2325; H01G 4/40
See application file for complete search history.

(56) References Cited

U.S. PATENT DOCUMENTS

| 2005/0156280 A1* | 7/2005 | Patel .................. H01L 24/81 257/E23.079 |
| 2011/0186978 A1* | 8/2011 | Kim .................. H01L 24/06 257/686 |
| 2019/0221543 A1 | 7/2019 | Sung | |

FOREIGN PATENT DOCUMENTS

| KR | 2011125796 A * 11/2011 .... H01L 2924/15311 |
| KR | 101774938 B1   9/2017 |

OTHER PUBLICATIONS

Chip Multilayer Ceramic Capacitors for General, Nov. 27, 2017, Cat. No. C02E-21, p. 249, Murata Manufacturing Co., Ltd.

* cited by examiner

*Primary Examiner* — Jasmine J Clark
(74) *Attorney, Agent, or Firm* — William Park & Associates Ltd.

(57) ABSTRACT

A semiconductor package may include a semiconductor chip mounted on a package substrate, and capacitors. The capacitors may be disposed between the package substrate and the first semiconductor chip, and the capacitors may support the first semiconductor chip.

14 Claims, 4 Drawing Sheets

SEMICONDUCTOR PACKAGE INCLUDING SEMICONDUCTOR CHIP AND CAPACITOR

CROSS-REFERENCE TO RELATED APPLICATIONS

The present application claims priority under 35 U.S.C 119(a) to Korean Application No. 10-2020-0046328, filed on Apr. 16, 2020, which is incorporated herein by references in its entirety.

BACKGROUND

1. Technical Field

The present disclosure generally relates to a semiconductor package technology and, more particularly, to a semiconductor package including a semiconductor chip and a capacitor.

2. Related Art

Various attempts have been made to integrate a plurality of semiconductor chips into a single package structure. As a plurality of semiconductor chips are arranged in a semiconductor package, the structure of the semiconductor package has become more and more complex. In addition, in order to secure electrical characteristics required for a semiconductor package, there is an increasing demand to dispose passive elements in the semiconductor package. As the structure of the semiconductor package is complicated, it is becoming increasingly difficult to secure a space in which the passive elements are to be placed in the semiconductor package.

SUMMARY

In an embodiment, a semiconductor package includes a package substrate, a first semiconductor chip disposed on the package substrate, and at least one capacitor disposed between the package substrate and the first semiconductor chip, wherein the at least one capacitor supports the first semiconductor chip.

In another embodiment, a semiconductor package includes a package substrate, at least one capacitor disposed on the package substrate, and a first semiconductor chip disposed solely on the at least one capacitor.

DETAILED DESCRIPTION

Figure 1:
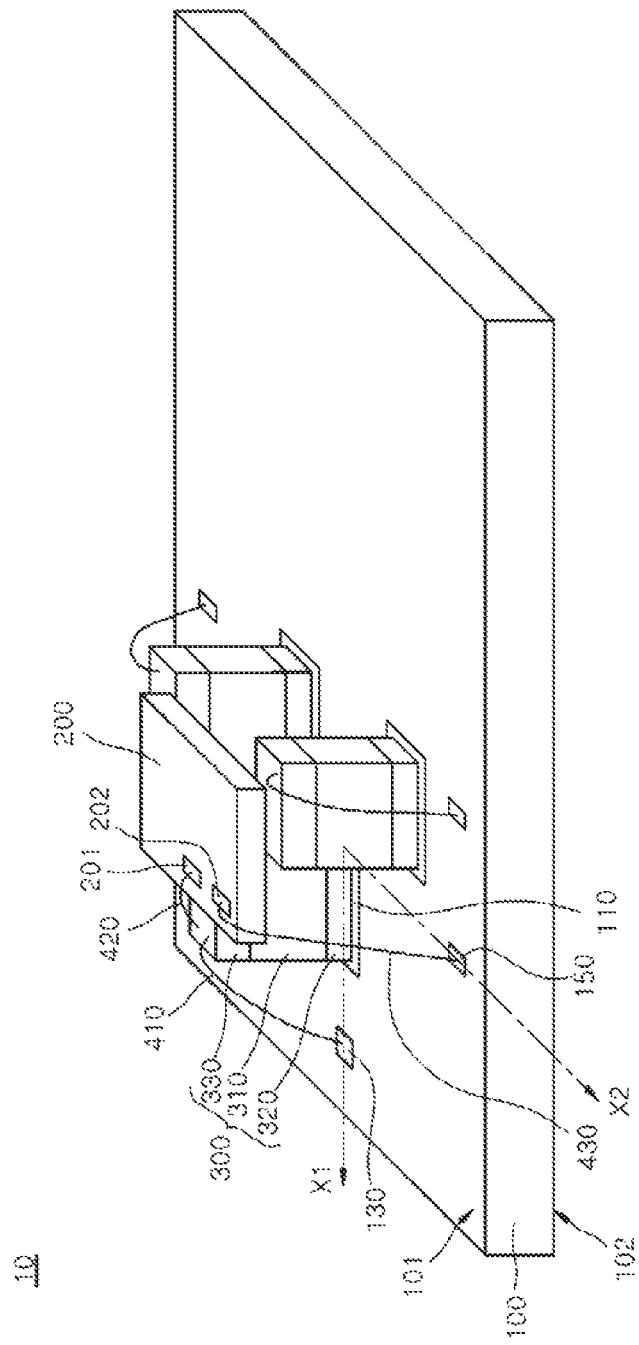
FIG. 1 is a perspective view, illustrating a semiconductor package, according to an embodiment.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third," etc. may be used herein to describe various elements, these elements should not be limited by these terms. These terms are only used to distinguish one element from another element, but not used to indicate a particular sequence or number of elements.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom," and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

Semiconductor packages, in accordance with various embodiments, may include electronic devices such as semiconductor chips or semiconductor dies. The semiconductor chips or the semiconductor dies may be obtained by separating a semiconductor substrate, such as a wafer into a plurality of pieces by using a die sawing process. The semiconductor chips may correspond to memory chips, logic chips, application specific integrated circuit (ASIC) chips, application processors (APs), graphic processing units (GPUs), central processing units (CPUs) or system-on-chips (SoCs). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor packages may be employed in communication systems, such as mobile phones, electronic systems associated with biotechnology or health care, or wearable electronic systems. The semiconductor packages may be applicable to internet of things (IoT).

Same reference numerals refer to same elements throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

FIG. 1 is a perspective view, schematically illustrating a semiconductor package 10, according to an embodiment.

Referring to FIG. 1, the semiconductor package 10 may include a package substrate 100, a first semiconductor chip 200, and a capacitor 300. At least one capacitor 300 may be disposed between the package substrate 100 and the first semiconductor chip 200. The plurality of capacitors 300 may be disposed on a first surface 101 of the package substrate 100 while being spaced apart from each other. As the first semiconductor chip 200 is disposed on the capacitors 300, a structure in which the capacitors 300 support the first semiconductor chip 200 may be configured. The capacitors 300 may serve as supporters that support the first semiconductor chip 200. The capacitors 300 may be disposed while overlapping the first semiconductor chip 200. As the capacitors 300 overlap the first semiconductor chip 200, the area required for the capacitors 300 to be disposed on the package substrate 100 may be reduced. The area of the package substrate 100 that is occupied by the capacitors 300 and the first semiconductor chip 200 may be reduced compared to a case in which the capacitors and the first semiconductor chip are disposed side by side without overlapping each other.

Figure 2:
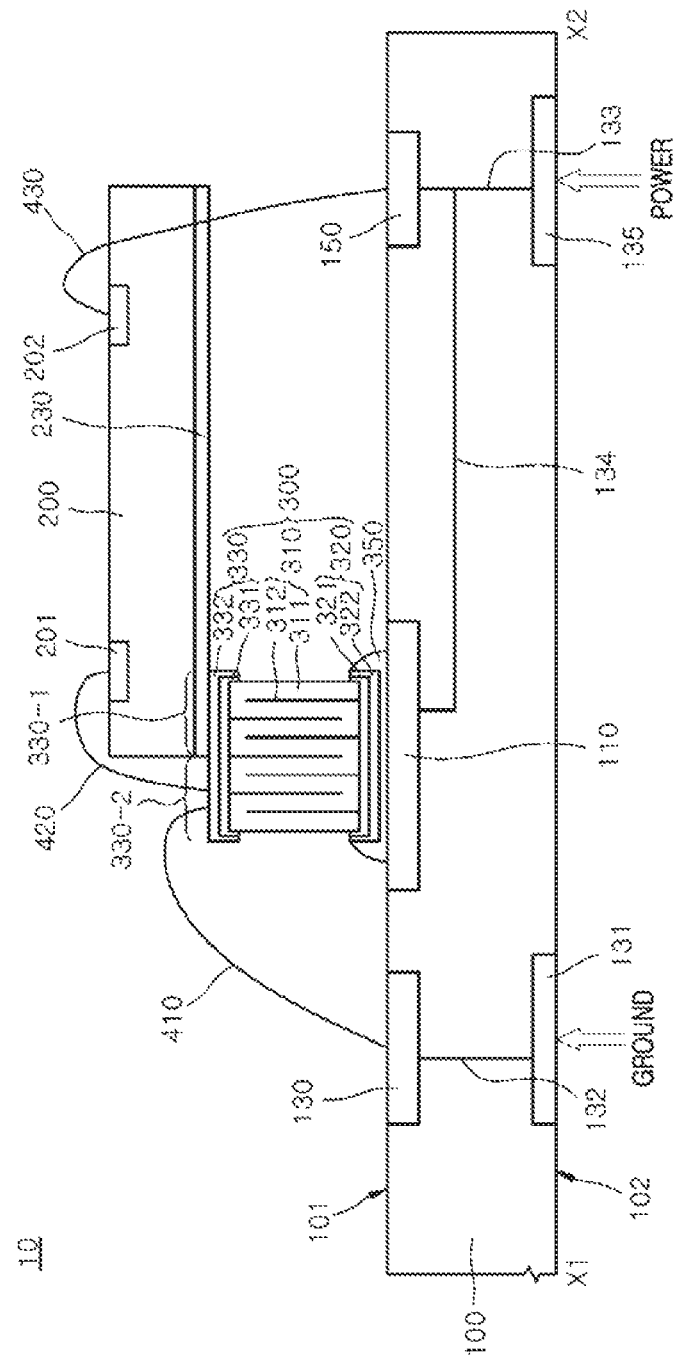
FIG. 2 is a cross-sectional view, illustrating a semiconductor package, according to an embodiment.

FIG. 2 is a cross-sectional view, schematically illustrating a semiconductor package 10, according to an embodiment. FIG. 2 schematically shows a cross-sectional shape of the semiconductor package 10 along a line X1-X2 of FIG. 1.

Referring to FIGS. 1 and 2, the capacitor 300 may be introduced in the form of a multilayer ceramic capacitor (MLCC). The capacitor 300 may include a capacitor body 310, a first outer terminal 320, and a second outer terminal 330. The capacitor body 310 may include inner electrodes 312 that are disposed as a plurality of layers in a dielectric layer 311. The dielectric layer 311 may be formed by laminating a plurality of sub dielectric layers. The inner electrodes 312 may be interlaced between the sub dielectric layers and alternately with each other.

The first and second outer terminals 320 and 330 may be disposed at both ends of the capacitor body 310, respectively. The first outer terminal 320 may include a first layer 321 and a second layer 322 of different metal materials. The first layer 321 of the first outer terminal 320 may be connected to some of the inner electrodes 312 and may be electrically coupled to some of the inner electrodes 312. The first layer 321 of the first outer terminal 320 may include a metal layer, such as a copper (Cu) layer. The second layer 322 of the first outer terminal 320 may be disposed as a metal layer that covers the first layer 321 of the first outer terminal. The second layer 322 of the first outer terminal 320 may include a nickel (Ni) layer that prevents contamination or oxidation of a copper (Cu) layer. The second layer 322 of the first outer terminal 320 may further include a gold (Au) layer that covers the nickel (Ni) layer. The gold (Au) layer may be a bonding layer that bonds or couples the first outer terminal 320 to other elements.

The package substrate 100 may include a conductive landing finger 110 on the first surface 101. The conductive landing finger 110 may refer to a part of a circuit wiring structure provided in the package substrate 100. The first outer terminal 320 of the capacitor 300 may be coupled to or bonded to the conductive landing finger 110 by a conductive adhesion layer 350. The conductive adhesion layer 350 may be introduced as a solder layer that contains a solder material.

The first outer terminal 320 may be coupled to the package substrate 100 so that the capacitor 300 may be electrically coupled to the package substrate 100. The second outer terminal 330 of the capacitor 300 may be positioned at an end that is opposite to the first outer terminal 320 with the capacitor body 310 being interposed therebetween. The capacitor 300 may be mounted on the package substrate 100 in a way that the first outer terminal 320, the capacitor body 310, and the second outer terminal 330 are sequentially stacked in a direction that is substantially perpendicular to the first surface 101 of the package substrate 100. The capacitor 300 may be mounted on the package substrate 100 to be substantially perpendicular to the first surface 101 of the package substrate 100.

The second outer terminal 330 may include a first layer 331 and a second layer 332 of different metal materials. The second outer terminal 330 may have substantially the same layer structure as the first outer terminal 320. The first layer 331 of the second outer terminal 330 may be connected to the rest of the inner electrodes 312 and may be electrically coupled to the rest of the inner electrodes 312. The first layer 331 of the second outer terminal 330 may include a metal layer, such as a copper (Cu) layer. The second layer 332 of the outer terminal 330 may be disposed as a metal layer that covers the first layer 331 of the second outer terminal 330. The second layer 332 of the second outer terminal 330 may include a composite layer of a nickel (Ni) layer and a gold (Au) layer.

Referring to FIG. 2, the first semiconductor chip 200 may be supported by at least one capacitor 300. A portion 330-1 of the second outer terminal 330 of the capacitor 300 may overlap the first semiconductor chip 200 so that the capacitor 300 may support the first semiconductor chip 200. A portion of the first semiconductor chip 200 may be coupled or bonded to the overlapped portion 330-1 of the second outer terminal 330 by an insulating adhesion layer 230. The insulating adhesion layer 230 may serve to fix the first semiconductor chip 200 to the capacitor 300.

Another portion 330-2 of the second outer terminal 330 might not be obscured by the first semiconductor chip 200 and may be exposed to the outside of the first semiconductor chip 200. The package substrate 100 may include a first bonding finger 130 under the first surface 101. A first bonding wire 410 may be wire-bonded such that one end of the first bonding wire 410 is bonded to the exposed portion 330-2 of the second outer terminal 330, and the other end of the first bonding wire 410 may be bonded to the first bonding finger 130. The first bonding wire 410 may electrically connect the second outer terminal 330 to the package substrate 100. The second layer 332 of the second outer terminal 330 may include a gold (Au) layer as a surface layer. When the first bonding wire 410 is a gold (Au) wire, the first bonding wire 410 may be easily bonded and coupled to the gold (Au) layer of the second outer terminal 330.

The first semiconductor chip 200 may include a first chip pad 201 and a second chip pad 202, the second chip pad 202 being disposed to be spaced apart from the first chip pad 201. The first and second chip pads 201 and 202 may be connection terminals that apply electric signals to the first semiconductor chip 200.

A second bonding wire 420 may be wire-bonded to connect the exposed portion 330-2 of the second outer terminal 330 to the first chip pad 201 of the first semiconductor chip 200. The second bonding wire 420 may electrically connect the second outer terminal 330 of the capacitor 300 to the first semiconductor chip 200. The first and second bonding wires 410 and 420 may electrically connect the first semiconductor chip 200 to the first bonding finger 130 of the package substrate 100.

A ground terminal 131 may be disposed under a second surface 102 that is opposite to the first surface 101 of the package substrate 100. The package substrate 100 may include a first inner wiring 132 that connects the first bonding finger 130 to the ground terminal 131. When the first bonding finger 130 is connected to the ground terminal 131, the first and second bonding wires 410 and 420 may provide an electrical path to ground the first semiconductor chip 200. In this case, the second outer terminal 330, which is one terminal of the capacitor 300, may be connected to the electrical path which is configured to ground the semiconductor chip 200.

A ground terminal 131 may be disposed under a second surface 102 that is opposite to the first surface 101 of the package substrate 100. The package substrate 100 may include a first inner wiring 132 that connects the first bonding finger 130 to the ground terminal 131. When the first bonding finger 130 is connected to the ground terminal 131, the first and second bonding wires 410 and 420 may provide an electrical path to ground the first semiconductor chip 200. In this case, the second outer terminal 330, which is one terminal of the capacitor 300, may be connected to the electrical path to ground the first semiconductor chip 200.

A third bonding wire 430 may be wire-bonded to directly connect a second chip pad 202 of the first semiconductor chip 200 to a second bonding finger 150 of the package substrate 100. When the second bonding finger 150 is connected to a power terminal 135, the third bonding wire 430 may provide an electrical path to provide power to the first semiconductor chip 200.

The power terminal 135 may be disposed under the second surface 102 of the package substrate 100. The second inner wiring 133 that connects the second bonding finger 150 to the power terminal 135 may be disposed in the package substrate 100. The second bonding finger 150 may be disposed to be spaced apart from the first bonding finger 130 and the conductive landing finger 110. A third inner wiring 134 may be disposed in the package substrate 100 to electrically connect the conductive landing finger 110 to the second bonding finger 150.

The first outer terminal 320, which is the other terminal of the capacitor 300, may be electrically connected to the power terminal 135 through the conductive landing finger 110 that is connected to the first outer terminal 320, the third inner wiring 134, and the second inner wiring 133. In an embodiment, the third inner wiring 134 may be electrically connected to the power terminal 135. In addition, the capacitor 300 may be electrically connected to the first semiconductor chip 200 through the first outer terminal 320, the conductive landing finger 110, the third inner wiring 134, the second bonding finger 150, and the third bonding wire 430. Accordingly, the first outer terminal 320, which is the other terminal of the capacitor 300, may be connected to another electrical path that applies power to the first semiconductor chip 200.

As such, because the capacitor 300 is electrically connected between an electrical path that grounds the first semiconductor chip 200 and another electrical path that provides power to the semiconductor chip 200, the capacitor 300 may act as a decoupling capacitor that reduces noise during the operation of the first semiconductor 200. In an embodiment, the third bonding wire 430 may form an electrical path that grounds the first semiconductor chip 200, and the first and second bonding wires 410 and 420 may form an electrical path that provides power to the first semiconductor chip 200. In this case, the capacitor 300 may also be electrically connected between the electrical path that grounds the first semiconductor chip 200 and the electrical path that provides power to the first semiconductor chip 200.

Because the capacitor 300 can be mounted at a position where the capacitor 300 overlaps the first semiconductor chip 200, it is possible to secure the area of a region of the package substrate 100 on which the capacitor 300 is mounted. Accordingly, it is possible to mount a larger number of capacitors 300 on the package substrate 100, and it is possible to further increase the noise reduction effect due to the decoupling effect from the large number of capacitors 300. Accordingly, the electrical properties of the semiconductor package 10 may be improved.

Figure 3:
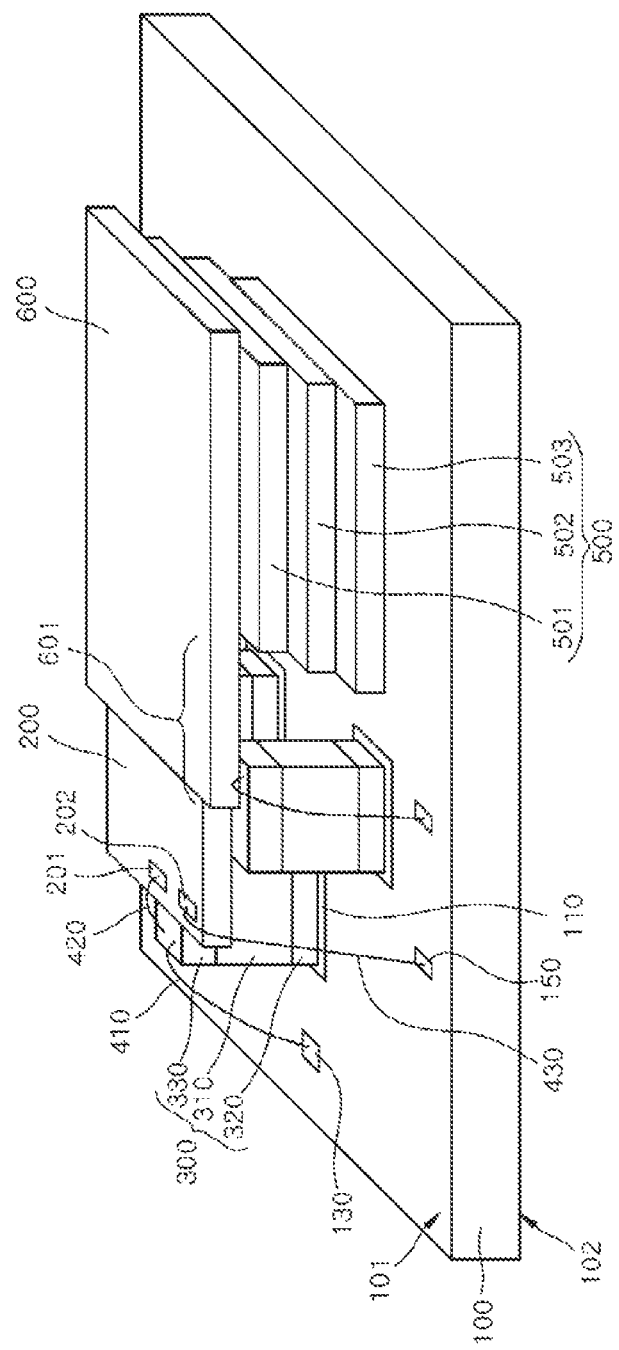
FIG. 3 is a perspective view, illustrating a semiconductor package, according to an embodiment.

FIG. 3 is a perspective view, schematically illustrating a semiconductor package 20, according to an embodiment. In FIG. 3, the same reference numerals as those of FIGS. 1 and 2 may be understood to refer to the same members.

Referring to FIG. 3, the semiconductor package 20 may include capacitors 300, a first semiconductor chip 200, a stack structure 500 of second semiconductor chips 501, 502, and 503, and a third semiconductor chip 600. The stack structure 500 of the second semiconductor chips 501, 502, and 503 may be disposed on a package substrate 100 to be spaced apart from the capacitors 300. The second semiconductor chip 502 of a second stage and the second semiconductor chip 503 of a third stage may be sequentially and vertically stacked on the second semiconductor chip 501 of a first stage. The second semiconductor chips 501, 502, and 503 of the first stage, second stage, and third stage may be stacked at positions offset by a predetermined distance from each other. The second semiconductor chips 501, 502, and 503 of the first stage, second stage, and third stage may be stacked vertically in a stair-shaped stack structure 500.

The first semiconductor chip 200 may be supported by the capacitors 300 to have a height that is equal to the height of the stack structure 500 of the second semiconductor chips. The third semiconductor chip 600 may be further stacked on the first semiconductor chip 200 and the stack structure 500 of the second semiconductor chips. The third semiconductor chip 600 may be supported by the first semiconductor chip 200 and the stacked structure 500 of the second semiconductor chips together. The second semiconductor chips 501, 502, and 503 may be electrically connected to the package substrate 100 through bonding wires (not illustrated). The third semiconductor chip 600 may be electrically connected to the package substrate 100 through other bonding wires (not illustrated).

The third semiconductor chip 600 may have a larger size than the first semiconductor chip 200 or the second semiconductor chips 501, 502, and 503. When the third semiconductor chip 600 is larger than the second semiconductor chips 501, 502, and 503, a portion 601 of the third semiconductor chip 600 may protrude from a side surface of the stack structure 500 of the second semiconductor chip 501, 502, and 503 to be overhung. The stack structure of the capacitor 300 and the first semiconductor chip 200 may support the overhung portion 601 of the third semiconductor chip 600. Accordingly, it may be omitted to introduce a separate supporter to support the overhung portion 601 of the third semiconductor chip 600.

The second semiconductor chips 501, 502, and 503 constituting the stack structure 500 may include DRAM memory chips. The third semiconductor chip 600 may include a NAND memory chip. The first semiconductor chip 200 may include a controller that controls the second semiconductor chips 501, 502, and 503 and the third semiconductor chip 600.

Although not illustrated, a sealing material may be disposed to cover the package substrate 100 and cover and protect the capacitors 300, the first semiconductor chip 200, the stack structure 500 of the second semiconductor chips 501, 502, and 503, and the third semiconductor chip 600.

According to embodiments of the present disclosure, it is possible to present a semiconductor package structure in which capacitors are disposed to support a semiconductor chip. The capacitors may be disposed while overlapping the semiconductor chip. With such an arrangement structure, it is possible to secure a space in which passive elements are to be disposed in the semiconductor package. Accordingly, the space utilization in the semiconductor package may be improved.

Figure 4:
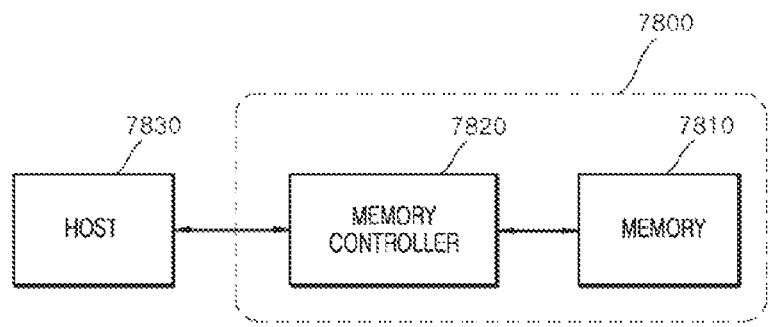
FIG. 4 is a block diagram, illustrating an electronic system employing a memory card, including a package, according an embodiment.

FIG. 4 is a block diagram, illustrating an electronic system, including a memory card 7800 that employs at least one of the semiconductor packages, according to the embodiments. The memory card 7800 may include a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 5:
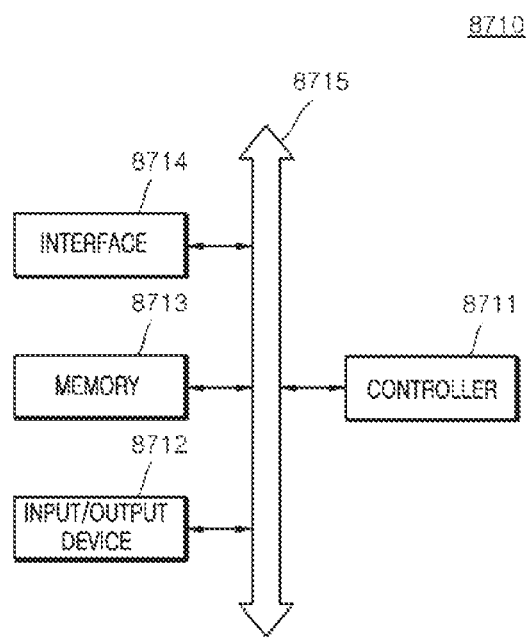
FIG. 5 is a block diagram, illustrating an electronic system including a package, according to an embodiment.

FIG. 5 is a block diagram, illustrating an electronic system 8710 including at least one of the semiconductor packages according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device, such as a DRAM, and/or a nonvolatile memory device, such as a flash memory. For example, a flash memory may be mounted to an information processing system, such as a mobile terminal or a desktop computer. The flash memory may constitute a solid state disk (SSD). In this case, the electronic system 8710 may stably store a large amount of data in a flash memory system.

The electronic system 8710 may further include an interface 8714 that is configured to transmit and receive data to and from a communication network. The interface 8714 may be a wired or wireless type. For example, the interface 8714 may include an antenna or a wired or wireless transceiver.

The electronic system 8710 may be a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment that is capable of performing wireless communication, the electronic system 8710 may be used in a communication system by using a technique of code division multiple access (CDMA), global system for mobile communications (GSM), north American digital cellular (NADC), enhanced-time division multiple access (E-TDMA), wideband code division multiple access (WCDMA), CDMA2000, long term evolution (LTE), or wireless broadband Internet (Wibro).

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A semiconductor package comprising:
a package substrate;
a first semiconductor chip disposed on the package substrate; and
at least one capacitor disposed between the package substrate and the first semiconductor chip, wherein the at least one capacitor supports the first semiconductor chip,
wherein the capacitor comprises:
a capacitor body; and
first and second outer terminals disposed at both ends of the capacitor body, respectively,
wherein the first outer terminal is coupled to the package substrate, and wherein the second outer terminal supports the first semiconductor chip.

2. The semiconductor package of claim 1, wherein the second outer terminal comprises a nickel (Ni) layer and a gold (Au) layer.

3. The semiconductor package of claim 1, further comprising an insulating adhesion layer bonding the first semiconductor chip to the second outer terminal.

4. The semiconductor package of claim 1, wherein a portion of the second outer terminal is exposed without being covered by the first semiconductor chip,
further comprising a first bonding wire electrically connecting the portion of the second outer terminal to the package substrate.

5. The semiconductor package of claim 4, further comprising a second bonding wire connecting the one portion of the second outer terminal to the first semiconductor chip.

6. The semiconductor package of claim 5, wherein the first and second bonding wires provide electrical paths that connect the first semiconductor chip to the package substrate.

7. The semiconductor package of claim 5, wherein the package substrate comprises a conductive landing finger to which the first outer terminal is bonded through a conductive adhesion layer.

8. The semiconductor package of claim 7, wherein the conductive adhesion layer comprises a solder layer.

9. The semiconductor package of claim 7, wherein the package substrate further comprises a bonding finger electrically connected to the conductive landing finger through an inner wiring, and wherein the semiconductor package further comprises a third bonding wire connecting the first semiconductor chip to the bonding finger.

10. The semiconductor package of claim 9, wherein the third bonding wire provides an electrical path to provide power to the first semiconductor chip, and wherein the first and second bonding wires ground the first semiconductor chip.

11. The semiconductor package of claim 9, wherein the third bonding wire grounds the first semiconductor chip, and wherein the first and second bonding wires provide an electrical path to provide power to the first semiconductor chip.

12. The semiconductor package of claim 1, further comprising:

a stack structure disposed on the package substrate and spaced apart from the capacitor, wherein the stack structure comprises second semiconductor chips; and a third semiconductor chip supported by the stack structure of the second semiconductor chips and the first semiconductor chip together.

13. The semiconductor package of claim 1, wherein the capacitor comprises a multilayer ceramic capacitor (MLCC).

14. A semiconductor package comprising:

a package substrate;

at least one capacitor disposed on the package substrate; and a first semiconductor chip disposed solely on the at least one capacitor, wherein the capacitor comprises:

a capacitor body; and first and second outer terminals disposed at both ends of the capacitor body, respectively, wherein the first outer terminal is coupled to the package substrate, and wherein the second outer terminal supports the first semiconductor chip.

* * * * *